United States Patent
Kinzel

(10) Patent No.: US 7,642,768 B1
(45) Date of Patent: Jan. 5, 2010

(54) CURRENT SENSOR HAVING FIELD SCREENING ARRANGEMENT INCLUDING ELECTRICAL CONDUCTORS SANDWICHING MAGNETIC PERMEABILITY LAYER

(75) Inventor: Helmut Kinzel, Weinheim (DE)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/255,006

(22) Filed: Oct. 21, 2008

(51) Int. Cl.
*G01R 19/00* (2006.01)
*G01R 33/07* (2006.01)

(52) U.S. Cl. .................... 324/117 H; 324/127
(58) Field of Classification Search ............ 324/117 H, 324/117 R, 126, 127, 251, 252; 323/368; 338/32 H
See application file for complete search history.

(56) References Cited

U.S. PATENT DOCUMENTS

| | | | |
|---|---|---|---|
| 4,182,982 A | * | 1/1980 | Wolf et al. .................. 324/127 |
| 4,749,939 A | * | 6/1988 | Seitz ....................... 324/117 H |
| 4,864,223 A | * | 9/1989 | Joder et al. .............. 324/117 H |

* cited by examiner

*Primary Examiner*—Ernest F Karlsen
(74) *Attorney, Agent, or Firm*—Patents on Demand P.A.; Neil R. Jetter

(57) ABSTRACT

A current sensor includes a magnetic field sensing element, a first conductor including sandwich structure and second conductor including sandwich structure electrically coupled to one another. The magnetic field sensing element is interposed between the first and second sandwich structure. The magnetic field sensing element is operable to receive magnetic flux lines resulting from current flowing through the first and second conductor sandwich structure. The first and second conductor sandwich structure each include a top portion including at least a first electrical conductor, a bottom portion including at least a second electrical conductor, and a layer of magnetic permeable material different from the first and second electrical conductor interposed between the top portion and bottom portion. The magnetic permeable material shields (bypasses) stray magnetic fields from reaching the magnetic field sensing element, but does not measurably influence the magnetic field generated by the primary current to be measured.

21 Claims, 8 Drawing Sheets

CURRENT SENSOR HAVING FIELD SCREENING ARRANGEMENT INCLUDING ELECTRICAL CONDUCTORS SANDWICHING MAGNETIC PERMEABILITY LAYER

FIELD OF THE INVENTION

The present invention relates generally to electric current sensors based on magnetic field sensing.

BACKGROUND

Conventional magnetic field-based current sensors generally include a magnetic field sensor, an iron core, and an amplifier. The iron core surrounds an electrical conductor, generally comprising copper for carrying the current to be measured, the current to be measured resulting in a magnetic field generated in the iron core. The magnetic field sensor is arranged in a gap in the iron core. Thus, the field lines of the magnetic field induced in the iron core by the current to be measured pass through the magnetic field sensor. The magnetic field sensor generates an electrical output signal generally proportional to the current to be measured, and this signal is amplified by an amplifier, such as an operational amplifier.

The iron core in conventional current sensors primarily provides two functions. First, the conducting of the magnetic field induced by the current to be measured through the magnetic field sensor, and second, the screening of the magnetic field sensor from extraneous electric and magnetic fields which are known to cause measurement error. However, the use of iron cores results in a sensor cost that is often too expensive for many applications.

Some lower cost current sensors are known which dispense with the need for an iron core. However, such sensors generally do not provide sufficiently accurate primary current measurement, nor do they generally provide sufficient linearity (between the current to be measured flowing as primary current and the magnetic flux reaching the magnetic sensor).

For example, certain automobile current sensing applications are known to require precise measurement of electric current, such as for the control of motor and phase current in the electronic drive system. Small sensor size is also required based on the need to measure current directly on a printed circuit board. Moreover, low cost is also required in these automotive applications and other high volume applications. What is needed is a new current sensor design that provides improved sensor performance while also providing low cost.

SUMMARY

This Summary is provided to comply with 37 C.F.R. §1.73, presenting a summary of the invention briefly indicating the nature and substance of the invention. It is submitted with the understanding that it will not be used to interpret or limit the scope or meaning of the claims.

A current sensor comprises a magnetic field sensing element, a first conductor comprising sandwich structure and second conductor comprising sandwich structure electrically coupled to one another. The magnetic field sensing element is interposed between the first and second sandwich structure. The magnetic field sensing element is operable to receive magnetic flux lines resulting from current flowing through the first and second conductor sandwich structure.

The first and second conductor comprising sandwich structure each comprises a top portion comprising at least a first electrical conductor, a bottom portion comprising at least a second electrical conductor, and a layer of magnetic permeable material different from the first and second electrical conductor interposed between the top portion and bottom portion. The magnetic permeable material shields (bypasses) stray magnetic fields from reaching the magnetic field sensing element, but does not measurably influence the magnetic field generated by the primary current to be measured.

In another embodiment of the invention, the top portion comprises a first plurality of electrical conductors, wherein the first plurality of electrical conductors are electrically isolated from one another over at least a portion of their lengths, and the bottom portion comprises a second plurality of electrical conductors, wherein the second plurality of electrical conductors are electrically isolated from one another over at least a portion of their lengths.

In another embodiment of the invention, the first conductor comprising sandwich structure and second conductor comprising sandwich structure are integrated together and configured in a U-shape. The U-shape helps focus the magnetic flux in the air gap between the first conductor comprising sandwich structure and second conductor in which the magnetic field sensing element.

A control system comprises a current sensor according to an embodiment of the invention and a controller coupled to receive the current sensing signal and operably coupled to control at least one system. The controller can comprises an electric drive system controller for an automobile, such as for controlling at least one of the motor and phase current in the electronic drive system.

FIGURES

A fuller understanding of the present invention and the features and benefits thereof will be accomplished upon review of the following detailed description together with the accompanying drawings, in which.

Figure 2:
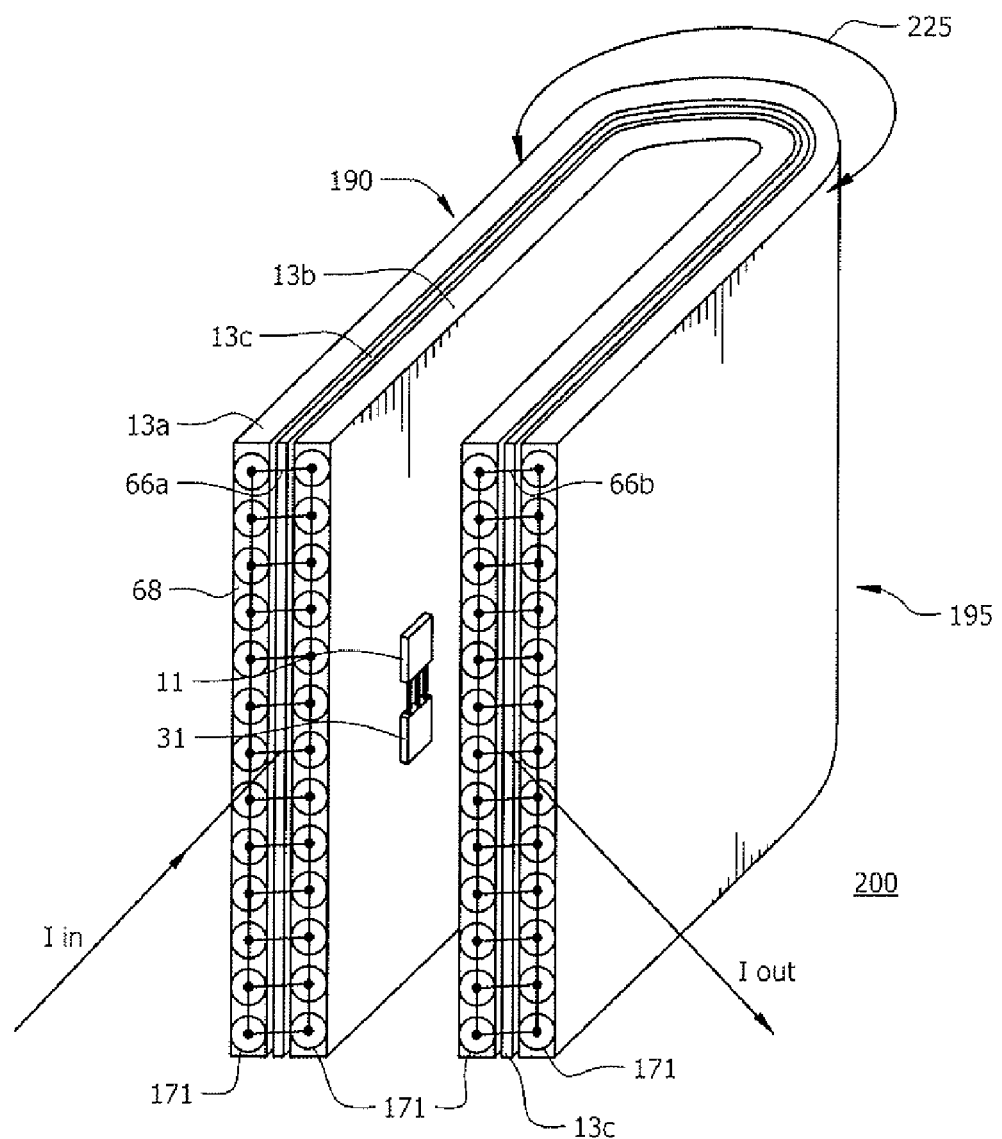

FIG. 2 is a simplified diagram of an exemplary current sensor comprising a first conductor comprising sandwich structure and a second conductor comprising sandwich structure integrally connected to one another and configured in a U-shape, wherein the top and bottom portions each comprise a plurality of electrical conductors that are electrically isolated from one another over their lengths except being all shorted together on respective ends, according to an embodiment of the invention.

Figure 3A:
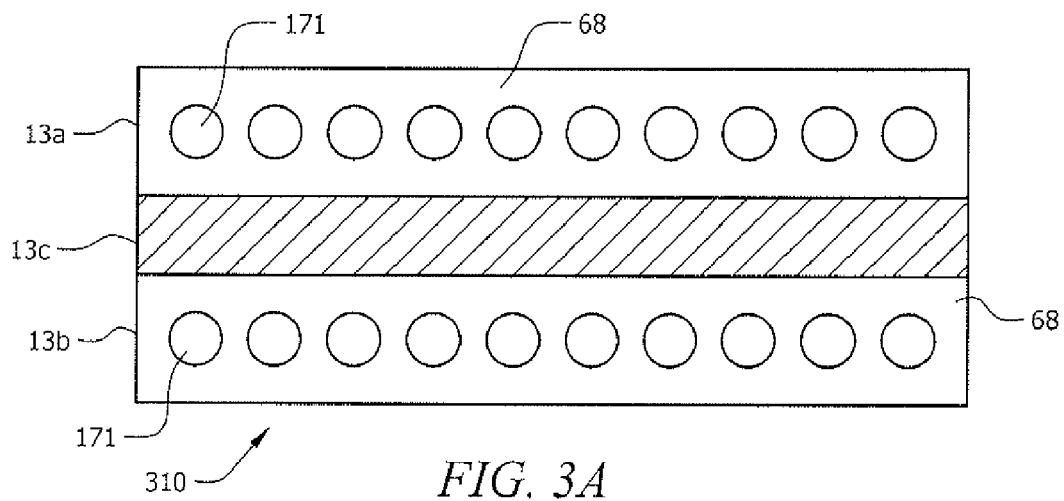

FIG. 3A shows a cross sectional view of an exemplary conductor sandwich structure, according to an embodiment of the invention.

Figure 3B:
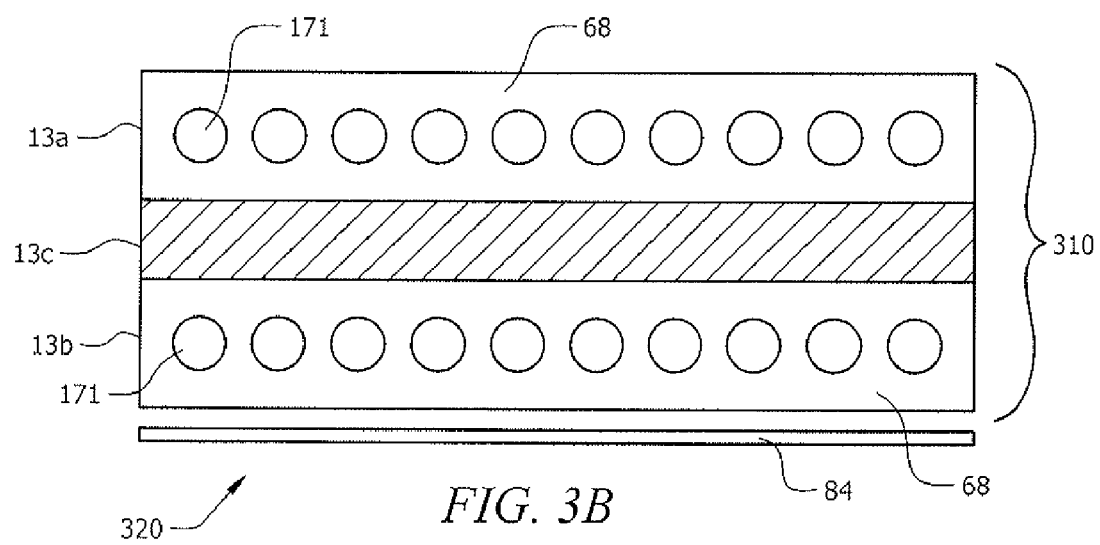

FIG. 3B shows a cross sectional view of shielded conductor sandwich structure having the same structure as conductor sandwich structure shown in FIG. 3A, but adding an electrically conductive sensor shielding layer electrically isolated from the conductor sandwich structure, according to an embodiment of the invention.

Figure 4:
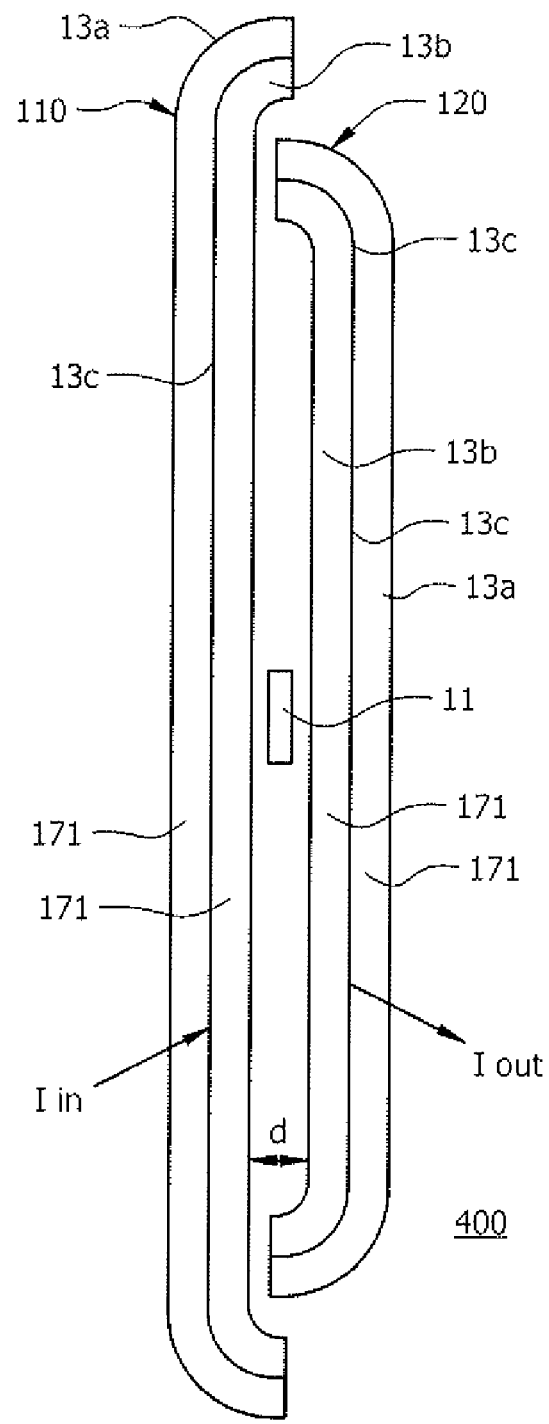

FIG. 4 shows a cross sectional depiction of an exemplary conductor sandwich arrangement having an overlapping configuration, where the first conductor sandwich structure and second conductor sandwich structure overlap one another, according to another embodiment of the invention.

Figure 5A:
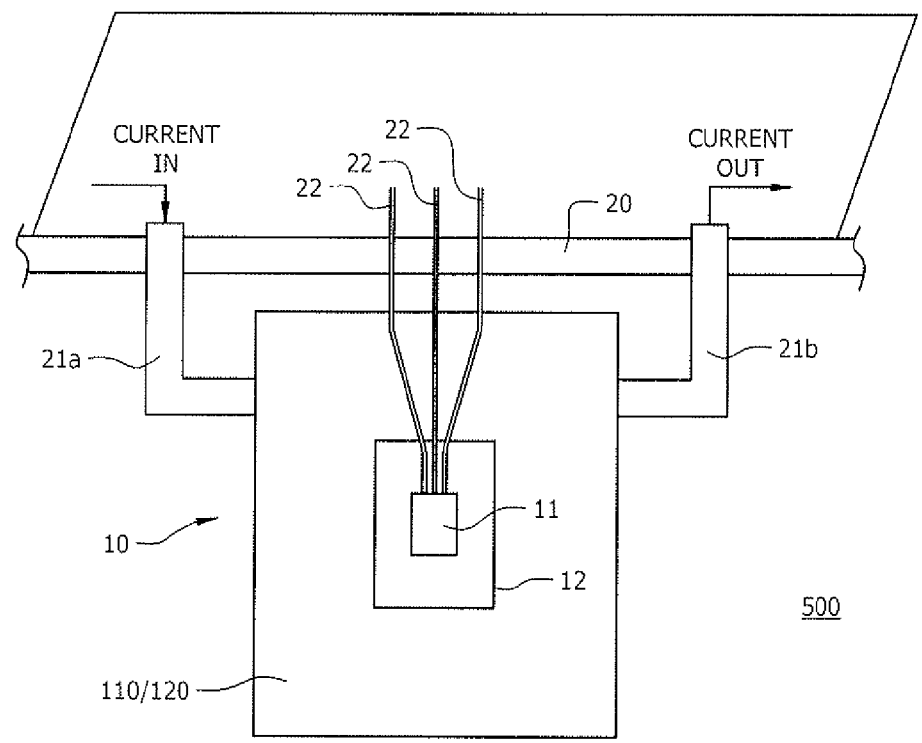
Figure 5A:
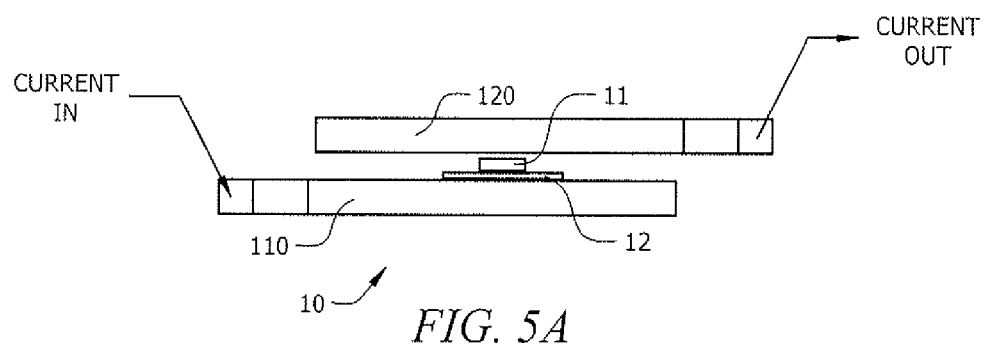

FIG. 5(a) shows the current sensor of FIG. 1 sensing a current flowing on a printed circuit board, along with a simplified cross section depiction of the sensor, according to an embodiment of the invention.

Figure 5B:
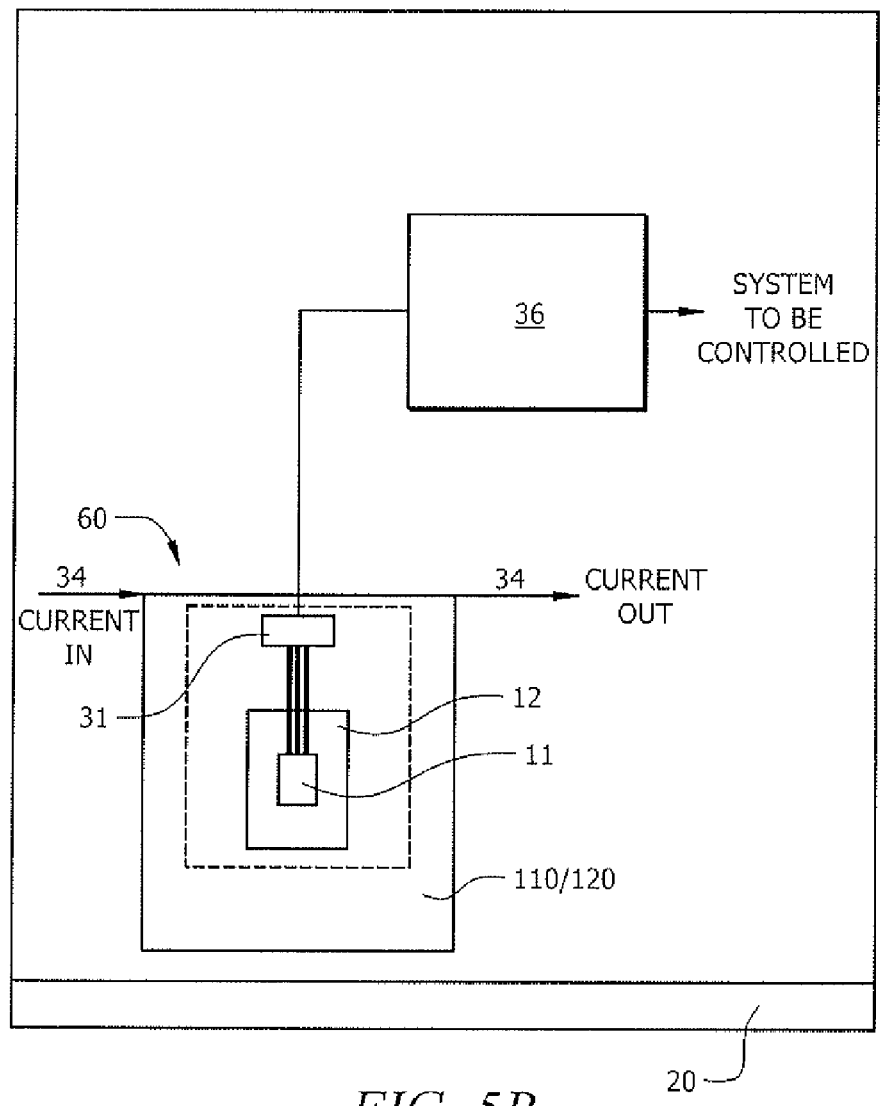

FIG. 5(b) is a depiction of a current sensor IC designed as an application specific integrated circuit (ASIC) comprising a Hall-effect or MR sensing element coupled to an amplifier, according to another embodiment of the invention.

Figure 6:
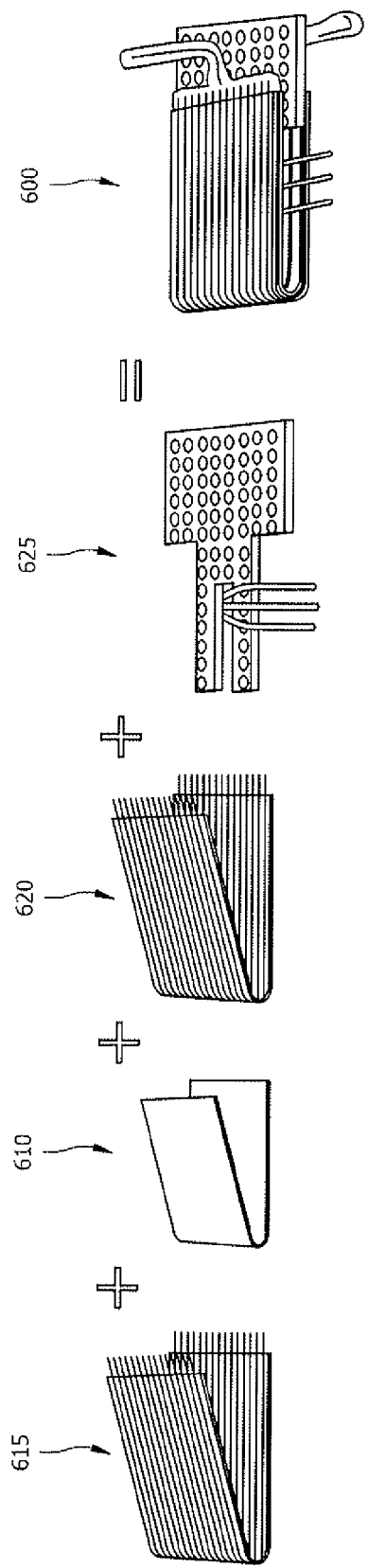

FIG. 6 shows a simplified assembly sequence for a current sensor according to an embodiment of the invention.

Figure 7:
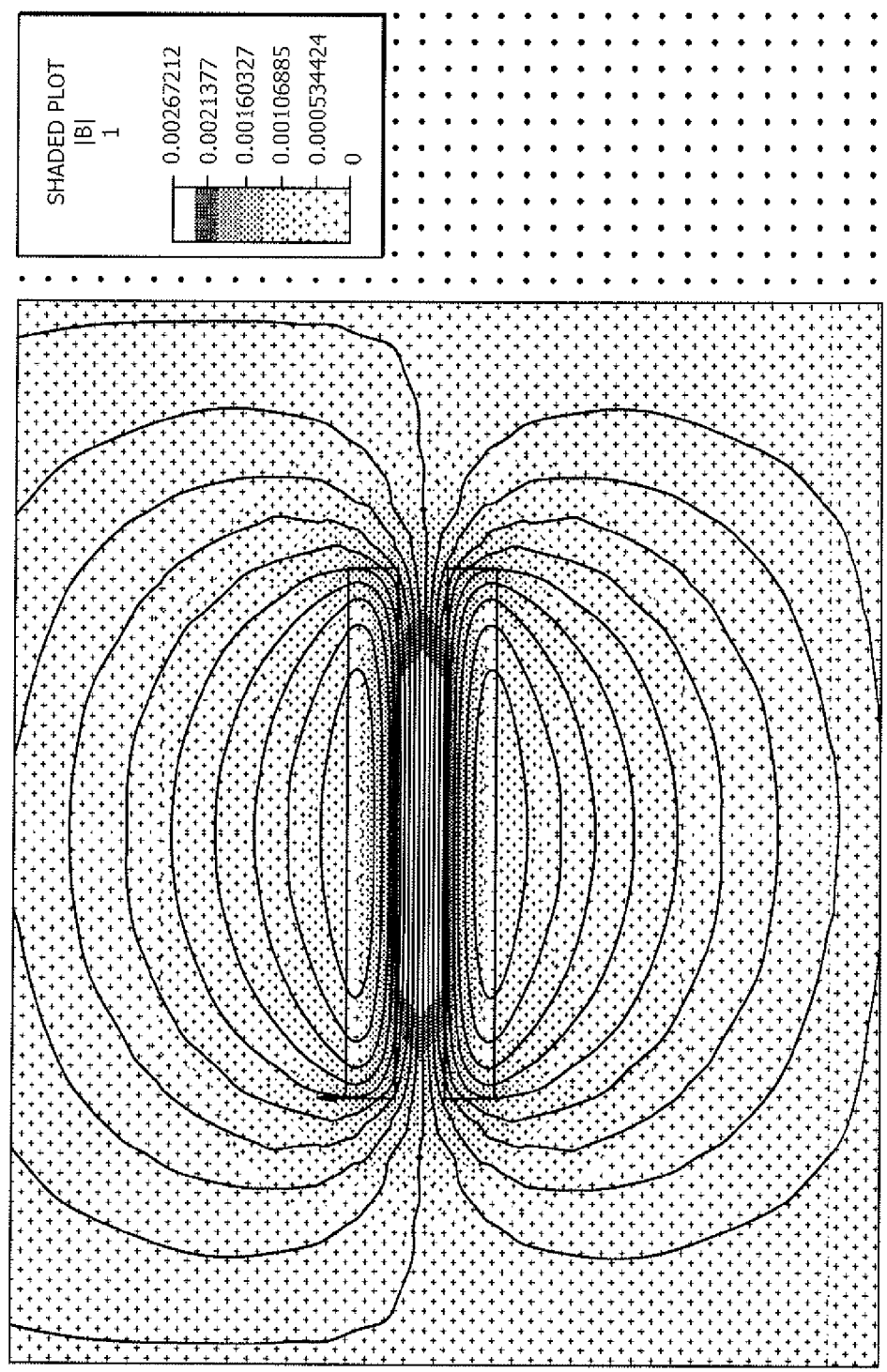

FIG. 7 shows simulation results for the B vector provided by an exemplary current sensor based on the current sensor shown in FIG. 6, according to an embodiment of the invention.

DETAILED DESCRIPTION

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1A:
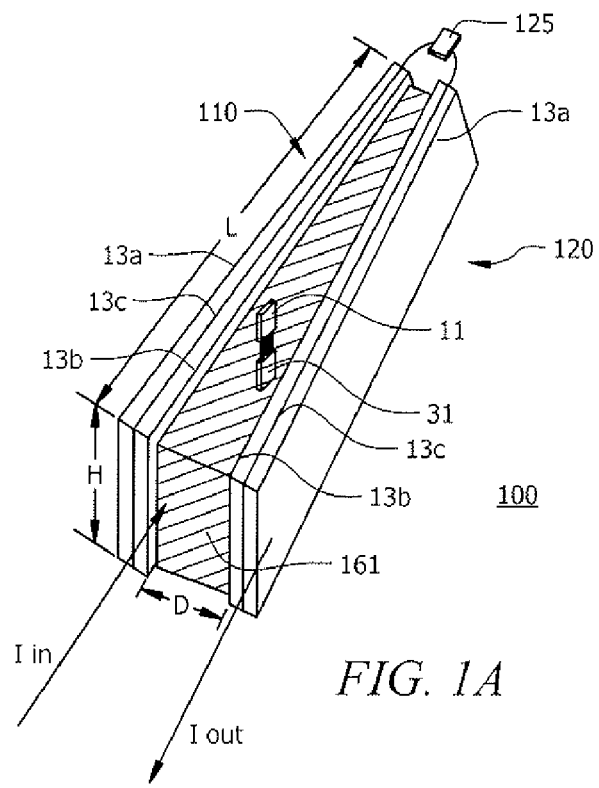
FIG. 1A is a simplified diagram of an exemplary current sensor according to one embodiment of the invention showing a first conductor sandwich structure and a second conductor sandwich structure electrically connected to one another by a coupling structure, according to an embodiment of the invention.

FIG. 1A is a simplified diagram of an exemplary current sensor 100 according to one embodiment of the invention comprising a first conductor comprising sandwich structure 110 and a second conductor comprising sandwich structure 120 electrically connected to one another by a coupling structure 125, according to an embodiment of the invention. Magnetic field sensing element 11 can generally comprises any magnetic field measuring technology, with or without an amplifier coupled to its output. The magnetic field sensing element 11 is located between the first and second conductor sandwich 110 and 120. For example, magnetic field sensor 11 can be a Hall-effect sensing element or a magnetoresistive (MR) sensing element. The MR sensing element can comprise a giant magneto-resistive (GMR) sensing element. MR sensing elements are generally adapted for relatively low current sensing, while Hall-effect sensing elements are generally adapted for relatively higher level current sensing. MR sensing elements are known to have higher sensitivity and dynamic range as compared to Hall-effect sensing elements. If a MR sensing element is used as sensing element 11, it may be necessary to modify its mounting as known in the art. An amplifier 31 is shown coupled to receive and amplify the electrical output signal provided by the magnetic field sensing element 11.

Coupling structure 125 electrically couples the first conductor sandwich structure 110 to the second conductor sandwich structure 120 so that the measurement current can flow, shown as Iin into first conductor sandwich structure 110 and Iout out from second conductor sandwich structure 120. The conductor comprising sandwich structures 110 and 120 each comprise a top portion 13a and a bottom portion 13b having a layer of magnetic permeable material 13c interposed between.

The magnetic permeable material 13c protects the magnetic field sensing element 11 from external (stray) electrical and magnetic fields by leading the stray fields away from the magnetic sensing element 11. This leading away generally results in significantly better sensor performance (e.g. linearity, accuracy), as compared to conventional current sensors. Although shown having comparable thicknesses, the thickness of magnetic permeable material 13c is generally more than an order of magnitude thinner as compared to the thickness of both top layer 13a and bottom layer 13b.

In one embodiment of the invention the thickness of the top layer 13a and bottom layer 13b are both generally about 1 mm for 25 A of measurement current. The thickness of magnetic permeable material 13c is generally 0.05 to 0.5 mm. It has been found that a 0.1 mm thick layer of magnetic permeable material 13c there is about a 40× improvement in stray field resistance as compared to a structure having no of magnetic permeable material 13c. For applications where a relatively high stray magnetic or electric fields may be experienced, the thickness of magnetic permeable material 13c can be increased to several mm to avoid or at least reduce saturation effects.

The magnetic permeable material 13c can be made from a variety of magnetic permeable materials. As used herein, the term "magnetic permeable material" refers to a material that provides a permeability (μ) of at least 500 μN/A at 0.002 T and zero frequency. The magnetic permeable material 13c is generally an iron or a ferrous alloy. In one embodiment, magnetic permeable material 13c comprises Mu-metal. Mu-metal is a nickel-iron alloy (75% nickel, 15% iron, plus copper and molybdenum) that has a very high magnetic permeability, about 25,000 μN/A at 0.002 T and zero frequency. A high magnetic permeability layer 13c is generally effective at screening static or time varying magnetic fields having a frequency up to more than about 200 kHz. The magnetic permeable material 13c can also have a bimetallic configuration, in which case Mu-metal may be combined with one or more metals, such as copper, in amounts from 10 to about 70 wt %.

The respective conductor sandwich structures 110 and 120 are shown sandwiching and thus providing magnetic field shielding for the magnetic field sensing element 11. The first conductor sandwich structure 110 and second conductor sandwich structure 120 are shown having a height "H" in FIG. 1A which is generally 1 to 10 mm and a length dimension "L" which is generally >10 mm. The first conductor sandwich structure 110 and second conductor sandwich structure 120 are shown spaced apart a distance shown as "D" opposite coupling structure 125, where "D" is generally on the order of several mm, such as 1 to 8 mm.

The magnetic field sensing element 11 is shown located centrally (around H/2, L/2 and midway in the D dimension) between the respective conductor sandwich structures 110 and 120 which can function as the housing for the current sensor 100. The magnetic field sensing element 11 is shown positioned vertically and is thus aligned in the height direction of the respective conductor sandwich structures 110 and 120. The height H of the first conductor comprising sandwich structure 110 and second conductor comprising sandwich structure 120 are generally both at least twice the height of the magnetic field sensing element 11.

Most highly magnetic permeable materials generally provide a lower electrical conductivity as compared to the electrical conductivity of certain available low cost non-magnetic permeable materials, such as copper. Since the respective conductive components of sandwich structure 110, 120 for sensor 100 are electrically in parallel with respect to magnetic permeable material 13c, and since the electrical conductivity of electrically conducting top and bottom portions 13a and 13b is significantly higher as compared to the magnetic permeable material 13c, the electrically conducting top and bottom layers 13a and 13b carry most of the measurement current. In one embodiment of the invention, electrically conducting top and bottom layers 13a and 13b are generally exclusive of any magnetically permeable material. By removing the need for the magnetic permeable material 13c to provide both high electrically conductivity and magnetic permeability, the current measured by current sensor 100 can thus be carried by relatively low cost highly electrically conducting generally non-magnetic permeable materials, such as copper.

In a typical embodiment, the current sensor 100 includes dielectric comprising material 161 for securing the magnetic field sensing element 11 to the first conductor comprising sandwich structure 110 and the second conductor comprising sandwich structure 120. In one embodiment, dielectric comprising material 161 can comprise plastic molding for potting or mounting the magnetic field sensing element 11.

Figure 1B:
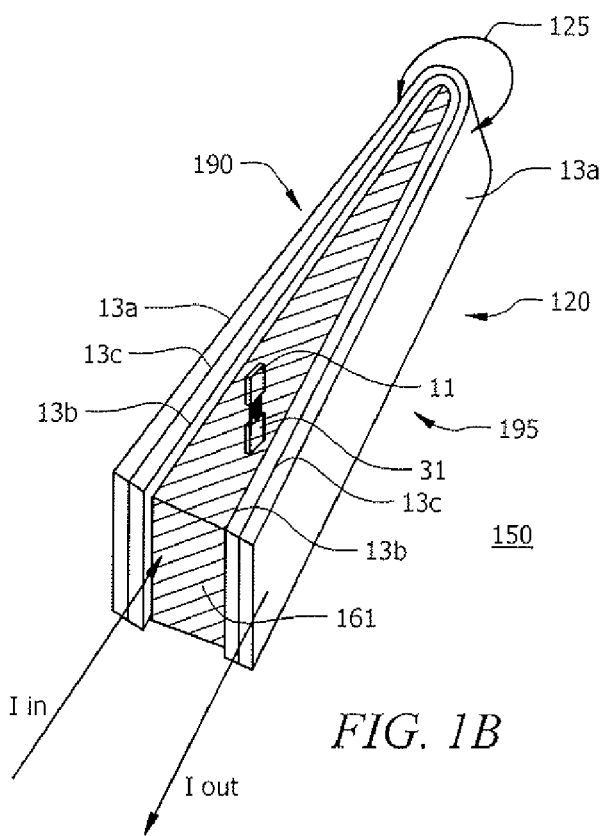
FIG. 1B is a simplified diagram of an exemplary current sensor according to one embodiment of the invention showing a first conductor sandwich structure and a second conductor sandwich structure integrally connected to one another and configured in a U-shape arrangement, according to an embodiment of the invention.

FIG. 1B is a simplified diagram of an exemplary current sensor 150 according to one embodiment of the invention showing details regarding a first conductor sandwich structure and a second conductor sandwich structure integrally connected (i.e. continuous components, no connectors) to one another and configured in a U-shape structure 125, according to an embodiment of the invention. As with sensor 100, the magnetic field sensing element 11 is shown centrally located within U-shape structure 125 for improved shielding. More specifically, the U-shape causes the current flowing through the first leg 190 and the second leg 195 of the U-shape structure 125 to be led in a generally U-shaped path, without the need for any notching, and as a result the field lines of the magnetic field generated by the current to be measured being led through the magnetic field sensing element 11.

FIG. 2 is a simplified diagram of an exemplary current sensor 200 according to one embodiment of the invention showing details regarding a U-shape structure 225 comprising first leg 190 and second leg 195 integrally connected to one another. The top 13a and bottom 13b portions each comprise a plurality of electrical conductors 171 (13 electrical conductors 171 shown for both top 13a and bottom 13b portions) that are electrically isolated from one another over their lengths except being all shorted together on respective ends, according to an embodiment of the invention. Dielectric material 68 provides electrical isolation between conductors 171 over their length.

The current sensor 200 receives the current to be measured shown as Iin shorting structure 66a which shorts together the respective electrically isolated electrical conductors 171 at their input ends. Similarly, shorting structure 66b shorts together the electrically isolated conductors 171 on the output end to deliver the output current Iout.

The use of a plurality of electrical conductors 171 by current sensor 200 for top and bottom portions 13a and 13b has been found by the Present Inventor to produce a significantly more homogeneous current distribution particularly for higher measurement currents, and when the height of the U-shape structure 225 is made relatively high for higher stray field immunity applications. In such arrangements, current sensors according to embodiments of the invention having a plurality of electrical conductors 171 result in a more homogeneous magnetic field as compared to a top or bottom portion 13a, 13b formed from a single continuous electrical conductor.

In this embodiment, the U-shaped structure 225 can comprise a ribbon cable configured in the U-shape. A ribbon cable (also known as multi-wire planar cable) is a cable with a plurality of electrically conducting wires running parallel to each other on the same flat plane. As a result the cable is wide and flat.

FIG. 3A shows a cross section view of an exemplary conductor sandwich structure 310 according to an embodiment of the invention, wherein the top and bottom portions 13a and 13b each comprise a plurality of electrical conductors.

FIG. 3B shows an arrangement 320 comprising the same structure as conductor sandwich structure shown in FIG. 3A, but adding an electrically conductive sensor shielding layer 84 electrically isolated from the conductor sandwich structure, according to an embodiment of the invention. Shielding layer 84 positioned adjacent to the outside surface of conductor sandwich structure 310 can help prevent arcing coupling to the conductor sandwich structure 310 which can occur in certain application environments, and result in measurement error or damage to the current sensor. Shielding layer 84 can also provide shielding against electric fields. The sensor shielding layer 84 is shown electrically isolated from conductor sandwich structure 310, and can be formed of electrically conductive materials including copper and aluminum, such as in foil form. In certain applications, the sensor shielding layer 84 can be grounded (not shown).

FIG. 4 shows a cross sectional depiction of an exemplary conductor sandwich arrangement 400 having an overlapping configuration, where the first conductor sandwich structure 110 and second conductor sandwich structure 120 overlap one another, according to another embodiment of the invention. The magnetic field sensing element 11 has a sensor height, wherein the first conductor comprising sandwich structure 110 and second conductor comprising sandwich structure 120 overlap one another to surround the magnetic field sensing element to provide 360 degree field shielding for the entire height of magnetic sensing element 11. The overlapping configuration reduces stray field access from the otherwise unshielded portion between the respective conductor sandwiches 110, 120. The overlapping arrangement shown thus provides enhanced immunity against external stray magnetic fields.

FIG. 5A shows a current sensor system 500 comprising current sensor 10 in one of its applications of measuring the current carried by a conducting line on a printed circuit board (PCB) 20, according to an embodiment of the invention. A simplified cross section depiction of sensor 10 is also provided. Although not shown, the current sensor 10 is generally soldered to PCB 20 and thus placed in series with one or more current carrying lines to be measured on PCB 20. The conductor sandwich structure 110/120 is shown contacting current carrying line on PCB 20 via conducting terminals 21a and 21b. In this arrangement, the current sensor 10 is oriented perpendicular to the plane of PCB 20. Electrical data signals (voltage) from current sensing element 11 can be tapped via terminals 22 (3 terminals shown for a Hall-effect sensor) for further processing, such as for filtering and amplification.

Sensors according to the present invention can also be formed on integrated circuit substrates, such as silicon, particularly for lower current sensing, such as milliamps up to several amps (e.g. up to 25 A). In this embodiment, support structure 12 comprises a integrated circuit substrate having a semiconducting surface, such as a silicon substrate.

Fabrication of sensors according to the present invention as ICs, has the advantage of allowing mounting of integrated sensors to be in small packages (plastic dips) and be mounted on the PCB board parallel to the plane of the board, thus reducing the clearance required. FIG. 5B shows a depiction of a current sensor IC 60 according to an embodiment of the present invention designed as an application specific integrated circuit (ASIC) comprising a Hall-effect or MR sensing element 11 coupled to an amplifier 31 formed on a common substrate 12 and typically packaged in a single package, such as a plastic package. Pins (not shown) of the package are inserted into suitable connectors provided on PCB board 20. The system current to be measured is shown flowing along conducting line 34. The amplified sensor output from amplifier 31 is coupled to controller 36. In one embodiment controller 36 comprises an electric drive system controller for an automobile, such as for controlling at least one of the motor and phase current in the electronic drive system of the automobile.

Recent advances have resulted in the ability to also add an ADC (Analog to Digital) converter and I$^2$C (Inter-integrated circuit communication protocol) IC for direct connection to a microcontroller's I/O port which can also be integrated into a single package. In another embodiment, the sensor IC can include both Hall-effect and MR-based sensors, with a switch for switching between the respective sensors based on a predetermined current level. In one embodiment, the MR-based sensor is operable at lower current, while the Hall-effect sensor would be operable at higher current. The sensor signal could also be temperature compensated using known temperature sensor circuits (PTATs). Moreover, the IC can also including a wireless transmitter and on-chip antenna for transmitting the detected signal to a remote monitoring location.

Besides the exemplary automotive applications described above, there are other applications for current sensors according to embodiments of the invention. Such applications include, but are not limited to, motor current control in frequency inverters, phase current control in servo-drives, overload protection for motors and power semiconductors, control of energy systems (e.g. wind energy), current control and monitoring in welding equipment, current regulation in switching mode power supplies, current control in uninterruptible power supplies, battery current diagnosis in motor vehicles, ground fault detection, and for laboratory test equipment.

EXAMPLES

The following non-limiting Examples serve to illustrate selected embodiments of the invention. It will be appreciated that variations in proportions and alternatives in elements of the components shown will be apparent to those skilled in the art and are within the scope of embodiments of the present invention.

FIG. 6 shows a simplified assembly sequence for a current sensor 600 according to an embodiment of the invention. A foil layer (e.g. about 0.1 mm thick) of magnetic permeable material 610, such as Mu-metal foil, is bent in a U-shape and interposed between a first and second ribbon cable 615 and 620 also bent into the same general U-shape to form a U-shaped sandwich structure (not shown). Gluing or other assembly may be used. The area of the U-shaped sandwich structure generally is based on the particular application, which generally defines the current to be measured. For example, in one exemplary embodiment the area can be 5 to 20 mm by 5 to 20 mm. A PCB board 625 having a Hall sensing element and associated electronics generally including an amplifier and other ASICs is positioned inside the U-shaped sandwich structure, and is then secured to the U-shaped sandwich structure form current sensor 600.

FIG. 7 shows simulation results for the B vector provided by an exemplary current sensor based on sensor 600 in a single copper arrangement analogous to that shown in FIG. 1B, according to an embodiment of the invention. The simulation results demonstrate a very linear field between respective conductor sandwich structures. The simulation also shows essentially zero fields inside of the conductors.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. 1.72(b), requiring an abstract that will allow the reader to quickly ascertain the nature of the technical disclosure. It is submitted with the understanding that it will not be used to interpret or limit the scope or meaning of the following claims.

I claim:

1. A current sensor, comprising:
   a magnetic field sensing element;
   a first conductor comprising sandwich structure and second conductor comprising sandwich structure electrically coupled to one another, wherein said magnetic field sensing element is interposed between said first and second sandwich structure;

said first and said second conductor comprising sandwich structure each comprising:

a top portion comprising at least a first electrical conductor;

a bottom portion comprising at least a second electrical conductor; and a layer of magnetic permeable material different from said first and said second electrical conductor interposed between said top portion and said bottom portion, wherein said magnetic field sensing element is being operable to receive magnetic flux lines resulting from current flowing through said first and said second conductor sandwich structure.

2. The current sensor of claim 1, wherein:

said top portion comprises a first plurality of electrical conductors, said first plurality of electrical conductors being electrically isolated from one another over at least a portion of their lengths, and said bottom portion comprises a second plurality of electrical conductor, said second plurality of electrical conductors being electrically isolated from one another over at least a portion of their lengths.

3. The current sensor of claim 2, wherein said first plurality of electrical conductors are electrically isolated from one another over said lengths except being all shorted together on respective ends and said second plurality of electrical conductors are electrically isolated from one another over said lengths except being all shorted together on respective ends.

4. The current sensor of claim 2, further comprising a dielectric material interposed between respective ones of said first plurality of electrical conductors and interposed between respective ones of said second plurality of electrical conductors for providing said electrical isolation.

5. The current sensor of claim 1, wherein said first conductor sandwich structure and said second conductor sandwich structure are integrated to one another and configured in a U-shape integrated structure.

6. The current sensor of claim 5, wherein said U-shape integrated structure comprises a ribbon cable.

7. The current sensor of claim 1, wherein said first electrical conductor and said second electrical conductor comprise primarily copper by weight.

8. The current sensor of claim 7, wherein said wherein said first electrical conductor and said second electrical conductor consist essentially of said copper by weight.

9. The current sensor of claim 1, wherein said magnetic permeable material provides a magnetic permeability of at least 1,000 $\mu N/A^2$ at 0.002 T and zero frequency.

10. The current sensor of claim 9, wherein said magnetic permeable material comprises an iron-nickel copper alloy.

11. The current sensor of claim 1, wherein said magnetic field sensing element has a sensor height, and said first conductor comprising sandwich structure has a first height and said second conductor comprising sandwich structure has a second height, wherein said first height and said second height are both at least twice said sensor height.

12. The current sensor of claim 1, wherein said magnetic field sensing element has a sensor height and said first conductor comprising sandwich structure and second conductor comprising sandwich structure overlap one another to surround said magnetic field sensing element to provide 360 degree field shielding for said entire sensor height.

13. The current sensor of claim 1, further comprising dielectric material for securing said magnetic field sensing element to said first conductor comprising sandwich structure and said second conductor comprising sandwich structure.

14. The current sensor of claim 1, further comprising a support structure, said magnetic field sensing element being positioned on said support structure, wherein said support structure comprises a substrate having a semiconductor surface, said current sensor being an integrated current sensor formed on said surface.

15. The current sensor of claim 14, further comprising an amplifier formed on said surface coupled to an output of said magnetic field sensing element.

16. The current sensor of claim 1, wherein said magnetic field sensor comprises a Hall-effect sensor.

17. The current sensor of claim 1, wherein said magnetic field sensor comprises a magneto resistance-based sensor.

18. A controlled system including at least one system having a system current, comprising:

a current sensor for providing a current sensing signal representative of said system current received comprising a magnetic field sensing element, a first conductor comprising sandwich structure and second conductor comprising sandwich structure electrically coupled to one another, wherein said magnetic field sensing element is interposed between said first and second sandwich structure;

said first and said second conductor comprising sandwich structure each comprising:

a top portion comprising at least a first electrical conductor;

a bottom portion comprising at least a second electrical conductor; and a layer of magnetic permeable material different from said first and said second electrical conductor interposed between said top portion and said bottom portion, said magnetic field sensor being operable to receive magnetic flux lines resulting from said system current flowing through said first and said second conductor sandwich structure, and a controller coupled to receive said current sensing signal and operably coupled to control said system.

19. The system of claim 18, wherein said controller comprises an electric drive system controller for an automobile, said controller controlling at least one of motor and phase current in said electronic drive system.

20. The system of claim 18, wherein:

said top portion comprises a first plurality of electrical conductors, said first plurality of electrical conductors being electrically isolated from one another over at least a portion of their lengths, and said bottom portion comprises a second plurality of electrical conductor, said second plurality of electrical conductors being electrically isolated from one another over at least a portion of their lengths.

21. The system of claim 18, wherein said first conductor sandwich structure and said second conductor sandwich structure are integrated to one another and configured in a U-shape integrated structure.

* * * * *